United States Patent [19]

Tamaru

[11] Patent Number: 4,924,117

[45] Date of Patent: May 8, 1990

[54] LOGIC CIRCUIT HAVING AN ERROR DETECTION FUNCTION

[75] Inventor: Kiichiro Tamaru, Tokyo, Japan

[73] Assignee: Tokyo Shibaura Denki Kabushiki Kaisha, Kawasaki, Japan

[21] Appl. No.: 493,999

[22] Filed: May 12, 1983

[30] Foreign Application Priority Data

May 13, 1982 [JP] Japan ................................. 80581

[51] Int. Cl.$^5$ ..................... H03K 3/013; H03K 17/16; H03K 19/003; H03K 19/086

[52] U.S. Cl. .................................... 307/455; 307/511; 307/471; 307/355; 371/57.1; 371/63

[58] Field of Search ............... 307/443, 445, 450, 455, 307/467, 475, 357, 364, 510, 511, 355; 371/57, 63

[56] References Cited

U.S. PATENT DOCUMENTS

| | | | |
|---|---|---|---|
| 3,252,011 | 5/1966 | Zuk | 307/471 X |
| 3,321,639 | 5/1967 | Fowler et al. | 307/455 |
| 3,634,665 | 1/1972 | Carter et al. | 371/63 |
| 3,649,852 | 3/1972 | Bohley | 307/455 X |
| 3,655,998 | 4/1972 | Wilhelm | 307/455 |
| 4,041,326 | 8/1977 | Robinson | 307/455 |
| 4,074,151 | 2/1978 | Buckley, III et al. | 307/448 X |

FOREIGN PATENT DOCUMENTS 1939266 9/1975 Fed. Rep. of Germany .
2727139 12/1978 Fed. Rep. of Germany .
2524044 11/1981 Fed. Rep. of Germany .

OTHER PUBLICATIONS

J. H. Underwood, "Cascode Current Switch Alu", IBM Technical Disclosure Bulletin, vol. 21, No. 12, May 1979.
"Synchronizing Type Logic Circuit", Patent Abstracts of Japan, vol. 5, No. 44, Mar. 1981.
M. Auer et al., "Komplexe ECL-Schaltkreise", Radio Fernsehen Elektronik, 26 (1977), H.1.

Primary Examiner—John S. Heyman
Assistant Examiner—David R. Bertelson
Attorney, Agent, or Firm—Foley & Lardner, Schwartz, Jeffery, Schwaab, Mack, Blumenthal & Evans

[57] ABSTRACT

A logic circuit has two pairs of input terminals to each of which is applied a pair of input signals opposite in phase and a pair of output terminals for deriving a pair of output signals corresponding to the logical states of the two pairs of input signals. The logic circuit is further provided with a holding circuit which is adapted to hold the output signals in the same logical state when a pair of input signal having the same phase are applied to the input terminals.

2 Claims, 1 Drawing Sheet

LOGIC CIRCUIT HAVING AN ERROR DETECTION FUNCTION

BACKGROUND OF THE INVENTION

The present invention relates to a logic circuit and more particularly a logic circuit especially adapted to be used in VLSI systems.

ECLs (emitter-coupled logic circuits) have been recently widely used in various high-speed electronic circuits. ECLs which are fundamentally differential amplifiers can operate at high speeds and are adapted to be integrated.

When the input signals which are same in phase are applied to a prior art logic circuit, the logical outputs are indeterminate and sometimes the output signals which are opposite in phase may be derived. Therefore a multiplicity of such logic circuits are integrated into a large-scale logic circuit and if the large-scale circuit has some defects, the output signals which are opposite in phase are derived. As a result, it has been impossible to positively detect the internal defects.

SUMMARY OF THE INVENTION

The primary object of the present invention is therefore to provide a logic circuit whose defect can be correctly and readily detected by checking the relationship between the signals derived from the output terminals.

To the above and other ends, the present invention provides an ECL circuit characterized in that a circuit which is adapted to hold the output signals in the same phase relationship when the inputs in the same phase relationship are received is connected to the output circuit of the logic circuit.

According to the present invention, therefore, when the inputs in the same phase relationship are received, the output signals in the same phase relationship are derived. Therefore, when a multiplicity of such logic circuits are integrated into a large-scale logic circuit, the input signals in the same phase relationship are transmitted to and appear at the output terminals so that whether or not the large-scale logic circuit has any defects can be readily and correctly detected by checking the states of the output signals.

The logic circuits in accordance with the present invention are especially adapted to be incorporated in VLSI systems which use a multiplicity of logic circuits.

The above and other objects, effects and features of the present invention will become more apparent from the description of preferred embodiments thereof taken in conjunction with the accompanying drawings.

BRIEF DESCRIPTION OF THE DRAWINGS

Same reference characters or symbols are used to designate similar parts throughout the figures.

DETAILED DESCRIPTION OF THE INVENTION

Prior to the description of preferred embodiments of the present invention with reference to FIGS. 2 and 3, the prior art will be described briefly with reference to FIG. 1 so as to more distinctly point out the problems thereof.

Figure 1:
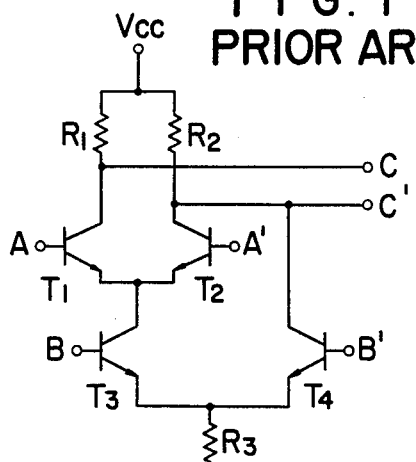
FIG. 1 is a diagram of a prior art ECL circuit.

In FIG. 1 is shown a prior art ECL NAND or AND circuit. Vcc is a positive current source while $V_{EE}$ is a negative current source. A first differential amplifier comprising a pair of transistors $T_1$ and $T_2$ and a second differential amplifier comprising a pair of transistors $T_3$ and $T_4$ are interconnected between these positive and negative current sources Vcc and $V_{EE}$, $R_1$, $R_2$ and $R_3$ are resistors.

Input logic signals which are opposite in phase are applied to a first input terminal A and a second input terminal A', respectively, of the logic circuit. In like manner, differential logic input signals are applied to a third input terminal B and a fourth input terminal B'. The first input terminal A is connected to the base of the transistor $T_1$; the second input terminal A' is connected to the base of the transistor $T_2$; the third input terminal B is connected to the base of the transistor $T_3$; and the fourth input terminal B' is connected to the base of the transistor $T_4$.

TABLE 1 shows the truth table in the case of the NAND operation of the logic circuit.

TABLE 1

| A | A' | B | B' | C | C' |
|---|----|----|----|----|----|
| 1 | 0 | 1 | 0 | 0 | 1 |
| 1 | 0 | 0 | 1 | 1 | 0 |
| 0 | 1 | 1 | 0 | 1 | 0 |
| 0 | 1 | 0 | 1 | 1 | 0 |

With this logic circuit, in order to accomplish the normal operation, a pair of signals which are opposite in phase must be simultaneously applied to the first and second input terminals A and A'. For instance, when A=1, A'=0. The same is true for the third and fourth input terminals B and B'.

The logic circuit of the type described has the problem that when the input signals are in phase, the output signal is indeterminate.

Figure 2:
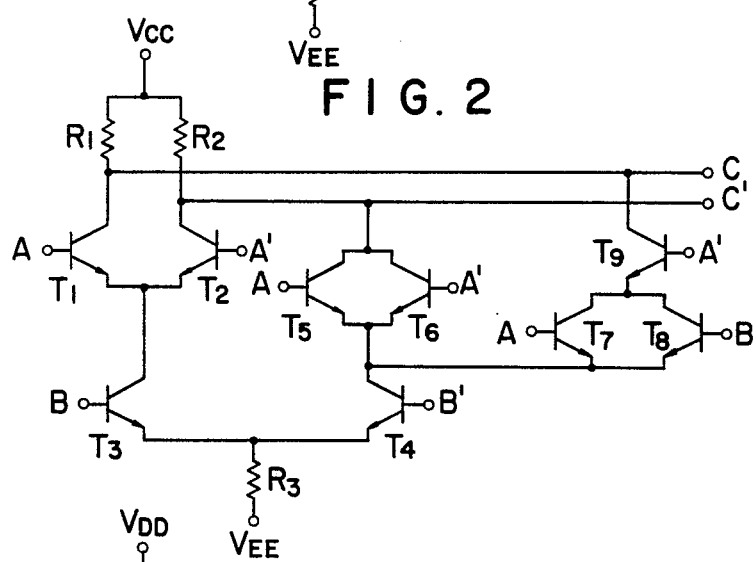
FIG. 2 is a diagram of a first embodiment of the present invention.

First Embodiment, FIG. 2

A logic circuit as shown in FIG. 2 is different from the logic circuit as shown in FIG. 1 in that a circuit (to be referred to as "a holding circuit" in this specification) comprising $T_5$, $T_6$, $T_7$, $T_8$ and $T_9$ is added.

The transistors $T_5$ and $T_6$ constitute a parallel circuit which in turn is connected to an output line connected to a first output terminal C'. In like manner, the transistors $T_7$ and $T_8$ constitute a parallel circuit which in turn is connected through the transistor $T_9$ to an output line connected to a second output terminal C.

The bases of the transistors $T_5$ and $T_7$ are connected to the first input terminal A while the bases of the transistors $T_6$ and $T_9$ are connected to the second input terminal A'. The base of the transistor $T_8$ is connected to the third input terminal B.

Next referring further to TABLE 2, the mode of operation of the first embodiment will be described. When the normal input signals which are opposite in phase are applied, either of the transistor $T_5$ or $T_6$ is enabled because the transistors $T_5$ and $T_6$ are connected in parallel to each other. The transistors $T_7$ and $T_9$ are connected in series to each other and the transistor $T_9$ is connected to the second output terminal C so that either of the transistor $T_7$ or $T_9$ is disabled. As a result, the output signals which are opposite in phase are derived. That is, in response to the input signals which are opposite in phase, the output signals which are also opposite in phase are derived. To put into another way, the normal operation of the first embodiment is substantially similar to that of the prior art logic circuit as shown in FIG. 1.

Next the mode of operation when the input signals which are in phase

TABLE 2

| A | A' | B | B' | C | C' |
|---|----|---|----|---|----|
| 1 | 0  | 1 | 0  | 0 | 1  |
|   |    | 0 | 1  | 1 | 0  |
|   |    | 1 | 1  | 0 | 0  |
|   |    | 0 | 0  | 1 | 1  |
| 0 | 1  | 1 | 0  | 1 | 0  |
|   |    | 0 | 1  | 1 | 0  |
|   |    | 1 | 1  | 0 | 0  |
|   |    | 0 | 0  | 1 | 1  |
| 1 | 1  | 1 | 0  | 0 | 0  |
|   |    | 0 | 1  | 0 | 0  |
|   |    | 1 | 1  | 0 | 0  |
|   |    | 0 | 0  | 1 | 1  |
| 0 | 0  | 1 | 0  | 1 | 1  |
|   |    | 0 | 1  | 1 | 1  |
|   |    | 1 | 1  | 1 | 1  |
|   |    | 0 | 0  | 1 | 1  | are applied will be described.

(1) When logic "1" is applied to both the first and second input terminals A and A', the transistors $T_1$, $T_2$, $T_5$, $T_6$, $T_7$ and $T_9$ are enabled so that the logic "0s" are derived from both the output terminals C and C' except the logic inputs "0s" are applied to the third and fourth input terminals B and B'. When the logic inputs to the third and fourth input terminals B and B' are "0s", the logic outputs "1s" are derived from the output terminals C and C'.

(2) When the logic inputs to the first and second input terminals A and A' are "0s", the transistors $T_1$, $T_2$, $T_5$, $T_6$, $T_7$ and $T_9$ are disabled so that logic outputs "1s" are derived from the output terminals C and C' regardless of the logic inputs to the third and fourth input terminals B and B'. The reason is that the transistors $T_1$, $T_2$, $T_5$, $T_6$, $T_7$, $T_8$ and $T_9$ are connected in series to the transistors $T_3$ and $T_4$.

(3) Other relationships between the inputs and outputs are shown in TABLE 2. When the inputs to the first and second input terminals A and A' or to the third and fourth input terminals B and B' are in phase, the output signals which are in phase are derived from the output terminals C and C'.

Figure 3:
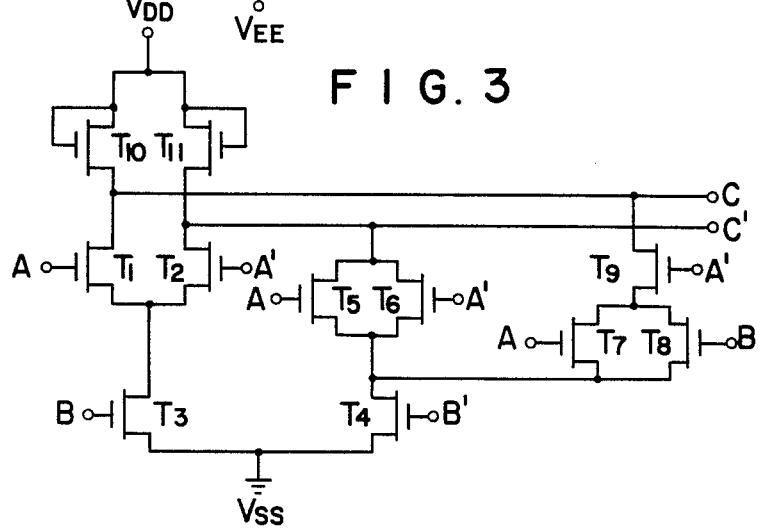
FIG. 3 is a diagram of a second embodiment of the present invention.

Second Embodiment, FIG. 3

In FIG. 3 is shown a second embodiment of the present invention which is different from the second embodiment as shown in FIG. 2 in that MOS transistors are used and that instead of the load resistors $R_1$ and $R_2$, MOS transistors $T_{10}$ and $T_{11}$ are used. The mode of operation of the second embodiment may be readily understood from the description of the first embodiment with reference to FIG. 2 so that no further description shall be made in this specification.

So far the present invention has been described in conjunction with the NAND/AND gate, but it is to be understood that when the first and second input terminals A and A' are replaced with the third and fourth input terminals B and B', respectively, while the third and fourth input terminals B and B', with the first and second input terminals A and A', respectively, an NOR/OR gate is provided. So far the present invention has been described in conjunction with the NPN transistors, it is to be understood that PNP transistors may be also used in the present invention.

According to the present invention, when the signals in the same phase are applied to the input terminals, the signals in the same phase are also derived from the output terminals. Therefore, breakdowns of very large scale integrated logic circuits comprising a multiplicity of discrete components can be readily checked only by checking the signals at the output terminals. So far in order to test VLSI systems, an input signal which results in an output signal different from an output signal derived from a normal VLSI system has been applied. Such testing method is not preferable because circuits are increased in size and it is difficult to generate such input signals used for testing.

What is claimed is:

1. A circuit for producing a pair of output signals indicative of either a result of a predetermined logical operation or the presence of an error condition, comprising:

first circuit means for receiving a first signal, a second signal which, absent error, is a logical inverse of said first signal, a third signal, and a fourth signal which absent error is a logical inverse of said third signal, for performing said logical operation on said first and third signals, and for producing a first output signal which, absent error, is indicative of the result of said logical operation, and a second output signal which is a logical inverse of said first output signal; and second circuit means for receiving said first, second, third, and fourth signals, and responsive to said first and second output signals, for, in the absence of error, outputting said first and second output signals unaltered as said pair of output signals, and otherwise, in the presence of error, for inverting one of said first and second output signals and then outputting said first and second output signals as said pair of output signals so that said first and second output signals are not mutually inverted, thus indicating said presence of error.

2. A method of producing a pair of output signals indicative of either a result of a predetermined logical operation or the presence of an error condition, comprising the steps of:

(a) receiving a first signal, a second signal which absent error is a logical inverse of said first signal, a third signal, and a fourth signal which, absent error, is a logical inverse of said third signal;

(b) performing said predetermined logical operation on said first and third signals;

(c) producing a first output signal which, absent error, is indicative of a result of said logical operation, and a second output signal which is a logical inverse of said first output signal; and (d) determining whether said second signal is a logical inverse of said first signal, and determining whether said fourth signal is a logical inverse of said third signal, and inverting one of said first and second output signals if either determination is negative.

* * * * *